US006208014B1

United States Patent
Wu et al.

(10) Patent No.: US 6,208,014 B1
(45) Date of Patent: Mar. 27, 2001

(54) USE OF MULTIFUNCTIONAL REAGENTS FOR THE SURFACE MODIFICATION OF NANOPOROUS SILICA FILMS

(75) Inventors: Hui-Jung Wu; James S. Drage, both of Fremont, CA (US); Douglas M. Smith, Albuquerque, NM (US); Teresa Ramos, Albuquerque, NM (US); Stephen Wallace, Albuquerque, NM (US); Neil Viernes, Waiaiua, HI (US)

(73) Assignee: AlliedSignal, Inc., Morristown, NJ (US)

( * ) Notice: Subject to any disclaimer, the term of this patent is extended or adjusted under 35 U.S.C. 154(b) by 0 days.

(21) Appl. No.: 09/235,186

(22) Filed: Jan. 22, 1999

Related U.S. Application Data (63) Continuation-in-part of application No. 09/111,084, filed on Jul. 7, 1998.

(51) Int. Cl.[7] ................................................. H01L 23/58
(52) U.S. Cl. ............................................ 257/629; 257/632
(58) Field of Search .................................. 257/629, 522, 257/759, 913, 632, 642; 438/409, 421, 623, 778, 780, 781

(56) References Cited

U.S. PATENT DOCUMENTS

| | | | |
|---|---|---|---|
| 5,723,368 | * | 3/1998 | Cho et al. ............................ 438/781 |
| 5,789,819 | * | 8/1998 | Gnade et al. ......................... 257/759 |
| 5,801,092 | * | 9/1998 | Ayers .................................... 438/623 |
| 5,804,508 | * | 9/1998 | Gnade et al. ......................... 438/778 |
| 5,807,607 | * | 9/1998 | Smith et al. ............................ 427/96 |
| 5,936,295 | * | 8/1999 | Havemann et al. ................. 257/522 |
| 5,955,140 | * | 9/1999 | Smith et al. ............................ 427/96 |

FOREIGN PATENT DOCUMENTS 0775669   5/1997   (EP) .

* cited by examiner

*Primary Examiner*—Minh Loan Tran
*Assistant Examiner*—Shouxiang Hu
(74) *Attorney, Agent, or Firm*—Melanie Brown; Leslie Weise (57) ABSTRACT

A process for treating silica dielectric film on a substrate, which includes reacting a suitable hydrophilic silica film with an effective amount of a multifunctional surface modification agent. The film is present on a substrate and optionally has a pore structure with hydrophilic pore surfaces, and the reaction is conducted for a period of time sufficient for said surface modification agent to penetrate said pore structure and produce a treated silica film having a dielectric constant of about 3 or less, wherein the surface modification agent is hydrophobic and suitable for silylating or capping silanol moieties on such hydrophilic surfaces. Dielectric films and integrated circuits including such films are also disclosed.

10 Claims, 2 Drawing Sheets

USE OF MULTIFUNCTIONAL REAGENTS FOR THE SURFACE MODIFICATION OF NANOPOROUS SILICA FILMS

BACKGROUND OF THE INVENTION

This patent application is a continuation-in-part of U.S. Ser. No. 09/111,084, filed on Jul. 7, 1998, the disclosure of which is incorporated herein in its entirety.

FIELD OF THE INVENTION

The present invention relates to low dielectric constant silica films and to improved processes for producing the same on substrates suitable for use in the production of integrated circuits.

DESCRIPTION OF THE PRIOR ART

As feature sizes in integrated circuits (ICs) approach 0.18 microns and below, it is believed that electrical insulation layers having a dielectric constant $\leq 2.5$ will be required for interlevel dielectric (ILD) and intermetal dielectric (MMD) applications.

Nanoporous Silica Films

One material with a low dielectric constant ("k") is nanoporous silica, which can be prepared with relatively low dielectric constants, by the incorporation of air, with a k of 1, in the form of nanometer-scale pores. Nanoporous silica is attractive because it employs similar precursors, including organic-substituted silanes, e.g., tetramethoxysilane ("TMOS") and/or tetraethoxysilane ("TEOS"), as are used for the currently employed spin-on-glasses ("SOG") and chemical vapor deposition ("CVD") of silica ($SiO_2$). Nanoporous silica is also attractive because it is possible to control the porosity, and hence the density, material strength and dielectric constant of the resulting film material. In addition to a low k, nanoporous silica offers other advantages including: 1) thermal stability to 900° C., 2) substantially small pore size, i e at least an order of magnitude smaller in scale than the microelectronic features of the integrated circuit), 3) as noted above, preparation from materials such as silica and TEOS that are widely used in semiconductors, 4) the ability to "tune" the dielectric constant of nanoporous silica over a wide range, and 5) deposition of a nanoporous film can be achieved using tools similar to those employed for conventional SOG processing.

One difficulty associated with nanoporous silica films is the presence of polarizable functional groups on internal pore surfaces. Pore surface functional groups present in previously available nanoporous films include silanol (SiOH), siloxane (SiOSi), alkoxy (SiOR), where R is an organic species such as, but not limited to, a methyl, ethyl, isopropyl, or phenyl groups, or an alkylsilane (SiR), where R is as defined previously. In particular, silanol groups are highly polarizable and hygroscopic. Since nanoporous silica has a relatively large (internal) surface area associated with its porous structure, the contribution of the highly polarizable silanol groups results in higher than desired dielectric constant values. Adsorption of environmental water by the silanol groups can potentially raise the dielectric constant of such materials even further.

Even if the dielectric film is outgassed by heating before subsequent processing, the presence of the polar silanols can contribute negatively to the dielectric constant and dielectric loss. Previously employed methods for overcoming this limitation and rendering the internal pore surfaces of nanoporous silica less polarizable and less hydrophilic include reacting the internal surface silanols with surface modifying agents, also referred to in the art as silylation agents or capping agents. Such capping agents include, e.g., chlorosilanes or disilazanes.

In one previously employed method of capping silanol groups on pore surfaces, an organic reagent such as hexamethyldisilazane (HMDZ) is introduced into the pores of the film and allowed to react with the surface silanol groups to cap the silanols by forming trimethylsilyl groups. These silylated surface groups are significantly less polarizable than the original silanols, and render the pore surfaces of the film hydrophobic. One disadvantage in the use of trimethylsilyl groups is that they are not very thermally stable and may out-gas during processing of the IC and cause via poisoning.

Another critical parameter of a nanoporous silica film is its mechanical strength. Generally the mechanical strength of a material decreases in proportion to any decrease in density in that material. For a nanoporous film to be useful as a dielectric film in IC devices, it is important that the combination of mechanical strength and low dielectric constant be optimized. For a given dielectric constant (which is proportional to refractive index and density), the density is fixed, at least for a specific chemical composition. With fixed density, the strength of the nanoporous silica is maximized by having the greatest fraction of solid within the skeleton of the film rather than as appended chemical groups on the surfaces of the nanometer-scale pores. Thus, in another drawback, reagents such as HMDZ introduce a significant additional mass, in the form of trimethylsilyl groups, to the pore surfaces. The disproportionate mass of the trimethylsilyl groups is not available to contribute to mechanical strength, but it does raise the density of the film and therefore is an obstacle to achieving the lowest possible k.

Thus, in view of the need for rapid competitive advances in the art of microprocessor, ie., IC fabrication, there remains a constant need in the art to improve upon previous methods and materials. In particular, there is a need to provide nanoporous silica films with hydrophobic pore surfaces, while minimizing mass introduced by hydrophobic surface modification agents at the nanometer-scale pore surfaces. The successful solution of this problem will provide greater material film strength for a given desired dielectric constant.

SUMMARY OF THE INVENTION

Surprisingly, the methods of the present invention are able to solve these and other problems in the art by providing multifunctional surface modification agents that are able to significantly reduce the additional appended mass and density added to silica dielectric films when capping free silanols, relative to previously employed methods and agents or reagents.

Accordingly, the invention provides novel processes for forming dielectric films or coatings on a desired substrate by the steps of (a) preparing a silica dielectric film on a substrate by any suitable methods, e.g., by any art known methods that produce a silica films in need of the surface modification provided by the present invention; and (b) reacting the film of (a) with a multifunctional surface modification agent under conditions, and for a time period, that is effective to silylate a substantial proportion of any free silanol groups on the film surfaces, so as to render the treated surface less polarizable and non-hygroscopic.

The silica dielectric film to be treated may be non-porous, but is preferably a nanoporous silica film prepared on the substrate immediately prior to the time of treatment, or may be previously prepared and stored or obtained from another source. It should also be mentioned that the silica dielectric films to be treated by the novel processes of the invention are optionally aged before or after conducting the surface modification treatment as described herein, but preferably, the film is aged prior to surface modification.

The inventive processes of the invention may be conducted using either a vapor phase or a liquid phase surface modification agent, as desired. Further, the processes are optionally conducted in the presence of a solvent or co-solvent, and it should be appreciated that when the surface modification is to be conducted in the liquid phase, the solvent or co-solvent will dissolve the surface modification agent without significantly dissolving the film to be treated. Any suitable material may be employed as a solvent or co-solvent, but preferably, such solvent or co-solvent is selected from the group consisting of ethers, esters, ketones, glycol ethers, chlorinated solvents, low viscosity siloxanes and suitable combinations thereof. In one alternative embodiment, the solvent or co-solvent is not a ketone.

While the silica film to be treated need not be porous, preferably, the film to be treated is a nanoporous dielectric film having a pore structure with hydrophilic pore surfaces, and the surface modification process is conducted for a period of time sufficient for the surface modification agent to penetrate the pore structure and to produce a treated nanoporous silica film having a dielectric constant of about 3 or less. Preferably, the surface modification reaction is conducted for a time period ranging from about 10 seconds to about 1 hour and at a temperature ranging from about 10° C. to about 100° C.

Preferably the film to be treated is on a substrate, e.g., a wafer suitable for production of an integrated circuit.

The invention also provides for dielectric films and an integrated circuit or circuits that include at least one dielectric film produced by the processes of the invention. Preferably, dielectric silica-based films produced by the inventive processes reveal no significant silanol absorbance in the wavelengths ranging from about 3000 to about 3700 $cm^{-1}$ under Fourier transform infrared spectroscopy.

DETAILED DESCRIPTION OF THE PREFERRED EMBODIMENT

Accordingly, in contrast to previously reported methods for rendering silica dielectric films and materials hydrophobic, the present invention provides for multifunctional surface modification reagents for optimizing mass devoted to providing mechanical strength while achieving the desired low dielectric constant properties in treated films.

The processes and reagents of the invention are applied to silica dielectric films. A number of methods for the preparation of nanoporous silica films on substrates are known to the art, as summarized in the "Description of the Prior Art", above. In addition, a number of variations and improvement to these generally known methods for the preparation of nanoporous films are taught by co-owned U.S. patent application Ser. Nos., 09/046,475 and 09/046,473, both filed on Mar. 25, 1998; U.S. patent application Ser. No. 09/054,262, filed on Apr. 3, 1998; and U.S. patent application Ser. Nos. 09/055,244 and 09/055,516, both filed on Apr. 6, 1998, the disclosures of which are incorporated by reference herein in their entireties.

In order to better appreciate the scope of the invention, it should be understood that unless the "$SiO_2$" functional group is specifically mentioned when the term "silica" is employed, the term "silica" as used herein, for example, with reference to dielectric films, is intended to refer to dielectric films prepared by the inventive methods from an organic or inorganic glass base material, e.g., any suitable silicon-based material. In addition, it should also be understood that the use of singular terms herein is not intended to be so limited, but, where appropriate, also encompasses the plural, e.g., exemplary processes of the invention may be described as applying to and producing a "film" but it is intended that multiple films can be produced by the described, exemplified and claimed processes, as desired.

Further, the use of the terms, "agent" or "agents" herein should be considered to be synonymous with the terms, "reagent" or "reagents," unless otherwise indicated.

Further still, although the description provided herein generally describes processes employed for treating nanoporous dielectric materials, the artisan will readily appreciate that the instantly provided methods and compositions are readily applied to nonporous dielectric silica films as well. Thus, nonporous films applied to a suitable substrate, e.g., a semiconductor wafer suitable for producing an integrated circuit, as described below, will also benefit from the methods and materials provided by the present invention. For example, adsorption of environmental water vapor onto hydrophilic silica films employed as insulators and the like in fabricating integrated circuits will cause problems such as an excessively high dielectric constant, current leakage and via poisoning. These additional problems are solved by the methods and compositions of the invention.

Substrates

Broadly speaking, a "substrate" as described herein includes any suitable composition formed before a nanoporous silica film of the invention is applied to and/or formed on that composition. For example, a substrate is typically a silicon wafer suitable for producing an integrated circuit, and the base material from which the nanoporous silica film is formed is applied onto the substrate by conventional methods, e.g., including, but not limited to, the art-known methods of spin-coating and dip-coating. Prior to application of the base materials to form the nanoporous silica film, the substrate surface is optionally prepared for coating by standard, art-known cleaning methods.

Suitable substrates for the present invention non-exclusively include semiconductor materials such as gallium arsenide ("GaAs"), silicon and compositions containing silicon such as crystalline silicon, polysilicon, amorphous silicon, epitaxial silicon, and silicon dioxide ("$SiO_2$") and mixtures thereof On the surface of the substrate is an optional pattern of raised lines, such as metal, oxide, nitride or oxynitride lines which are formed by well known lithographic techniques. Suitable materials for the lines include silica, silicon nitride, titanium nitride, tantalum nitride, aluminum, aluminum alloys, copper, copper alloys, tantalum, tungsten and silicon oxynitride. These lines form the conductors or insulators of an integrated circuit. Such are typically closely separated from one another at distances of about 20 micrometers or less, preferably 1 micrometer or less, and more preferably from about 0.05 to about 1 micrometer. Other optional features of the surface of a suitable substrate include previously formed nanoporous silica dielectric films The starting materials for conducting the processes of the invention also include a nanoporous silica film formed on the substrate by applying a silica precursor, such as a spin-on glass composition onto the substrate and then aging the film. The aging is typically conducted, for example, by treating the coated substrate with, e.g., ammonia and water vapor, to promote gelation.

Generally, the processes of the invention are conducted on the nanoporous film while it is still wet film, directly after aging. In alternative embodiments, the processes of the invention are optionally conducted on nanoporous silica films not yet subjected to aging, to dried nanoporous films and to nanoporous silica films that have been stored for a time period after completing the aging process. Thus, the film, as applied to the substrate, is typically catalyzed with an acid or base catalyst and additional water to cause polymerization/gelation ("aging") and to yield sufficient strength so that the film does not shrink significantly during drying.

While a number of alternative aging methods are known to the art, preferably, in the processes of the invention, the film is aged by treatment with ammonium hydroxide. As exemplified hereinbelow, the film is aged statically by exposing the film-bearing substrate to 15M ammonium hydroxide and water vapor in a confined chamber for a time period and under conditions that allow the water and ammonia vapor to diffuse into the film.

Multifunctional Surface Modification Agents

In order to optimize the density/dielectric constant parameters together with the need for sufficient mechanical strength, the invention provides a surface modification process using one or more multifunctional surface modification agents, so that the mass of the capping agent is minimized as a proportion of the density of the treated nanoporous film. Thus, within these broad parameters, a surface modification agent utilized by the invention is multifunctional, that is, each molecule of surface modification agent will have two or more functional groups and react with surface silanol functional groups while minimizing mass present outside the structural framework of the film, i e., mass not contributing to mechanical strength is minimized relative to presently employed monofunctional surface modification agents.

Thus, simply by way of example, the surface modification agent(s) according to the invention include any silane derivative that provides a suitable multifunctional hydrophobic moiety for capping the pore surface silanols. These include, simply by way of example and without limitation, suitable organosilanols such as Formula I wherein $R_1$ and $R_2$ are independently selected moieties, such as H and/or an organic moiety such as an alkyl, aryl or derivatives of these. When $R_1$ or $R_2$ is an alkyl, the alkyl moiety is optionally substituted or unsubstituted, and may be straight, branched or cyclic, and preferably ranges in size from $C_1$ to about $C_{18}$, or greater, and more preferably from $C_1$ to about $C_8$. When $R_1$ or $R_2$ is aryl, the aryl moiety preferably consists of a single aromatic ring that is optionally substituted or unsubstituted, and ranges in size from $C_5$ to about $C_{18}$, or greater, and more preferably from $C_5$ to about $C_8$. In a further option, the aryl moiety is not a heteroaryl.

Thus, $R_1$ or $R_2$ are independently selected from H, methyl, ethyl, propyl, phenyl, and/or derivatives thereof, provided that at least one of $R_1$ or $R_2$ is organic. In one embodiment, both $R_1$ and $R_2$ are methyl, and a trifunctional surface modification agent according to Formula I is methyltrimethoxysilane.

In another embodiment, a suitable organosilane according to the invention has the general formula of Formula II Wherein $R_1$, $R_2$, $R_3$ are independently H, alkyl and/or aryl. When any of $R_1$, $R_2$, $R_3$ are alkyl and/or aryl, they are defined as for Formula I, above. In preferred embodiments according to Formula II, $R_1$ is selected from H, $CH_3$, $C_6H_5$, and $R_2$ and $R_3$ are both $CH_3$. Thus trifunctional surface modification agents according to Formula II include, e.g., tris(dimethylamino)methylsilane, tris(dimethylamino) phenylsilane, and/or tris(dimethylarnino)silane.

In yet another embodiment, a suitable organosilane according to the invention has the general formula of Formula III wherein $R_1$, $R_2$, $R_3$ are independently H, alkyl and/or aryl. When any of $R_1$, $R_2$, $R_3$ are alkyl and/or aryl, they are defined as for Formula I, above. In one preferred embodiment, $R_1$ and $R_2$ are both $CH_3$, and $R_3$ is $CH_2CH_3$. Thus trifunctional surface modification agents according to Formula III include, e.g., methyltris(methylethylkeoxime) silane.

In yet a further embodiment, a suitable organosilane according to the invention has the general formula of Formula IV wherein $R_1$ is H, alkyl or aryl. When $R_1$ is alkyl and/or aryl, they are defined as for Formula I, above. In one preferred embodiment, $R_1$ is $CH_3$. Thus trifunctional surface modification agents according to Formula IV include, e.g., methyltrichlorosilane.

In a more preferred embodiment, the capping reagent includes one or more organoacetoxysilanes which have the following general formula, Formula V Preferably, x is an integer ranging in value from 1 to 2, and x and y can be the same or different and y is an integer ranging from about 2 to about 3, or greater.

Useful organoacetoxysilanes, including multifunctional alkylacetoxysilane and/or arylacetoxysilane compounds, include, simply by way of example and without limitation, methyltriacetoxysilane ("MTAS"), dimethyldiacetoxysilane (DMDAS), phenyltriacetoxysilane and diphenyldiacetoxysilane and combinations thereof.

Methods of Reacting Silica Dielectric Films with Surface Modification Agents

Although the exemplified methods for reacting silica films with surface modification agents are conducted in the liquid phase, the artisan will appreciate that surface modification agent or agents may be delivered into contact with the film to be treated in either a liquid phase, with or without an optional co-solvent or in the vapor phase, with or without an optional co-solvent, as described, e.g., in co-owned Ser. No. 09/111,084, filed Jul. 7, 1998, incorporated herein by reference in its entirety, provided that the reaction is conducted with an amount or concentration of surface modification agent(s) effective to provide a treated dielectric film having the desired range of dielectric constant and mechanical strength to produce a suitable integrated circuit on the substrate.

In one embodiment of the invention, the silica film is exposed to a vapor phase material that includes a surface modification agent as described herein and optionally in combination with a carrier gas, in an amount and under conditions effect to cap silanol moieties on the film surface.

It will be appreciated that a suitable vapor phase surface modification agent will exhibit a satisfactory boiling point/vapor pressure, reactivity, purity, and will yield an effective and heat stable hydrophobic surface on the treated film without causing significant undesirable effects. Surface modification agents desirably employed in the vapor phase will have suitable vapor pressures in the temperature range for conducting the surface modification treatment. Simply by way of example, and without limitation, the vapor pressure of a suitable surface modification agent will range from about 1 to about 500 torr. Preferably, the vapor pressure of a suitable surface modification agent will range from about 5 to about 100 torr. More preferably, the vapor pressure of a surface modification agent will range from about 5–100 torr. Most preferably, the vapor pressure of a surface modification agent will range from about 10 to about 50 torr.

The artisan will appreciate that any suitable art-known silylation agent may be employed in the processes of the invention in combination with an optional co-solvent, in either the vapor or liquid phase.

The surface modification agent is contacted with the silica dielectric film to be treated in a concentration that is effective to render the treated film substantially hydrophobic. The artisan will appreciate that the precise concentration to be employed will vary with the particular multifunctional surface modification reagent of choice and the desired processing conditions. However, the optimal concentrations will be readily determined by routine methods, followed by routine determinations of properties, e.g., dielectric constant, refractive index, stud pull force, and the like, of the resulting hydrophobic silica films. In particular, it will be appreciated that a sufficient degree of hydrophobicity is attained when the dielectric constant is below 3 and remains stable, i.e., it does not rise with absorption of environmental moisture.

Broadly, effective concentrations of surface modification agent will range from about 0.5 to about 25 percent, or greater, by weight, for trifunctional reagents. More preferred concentrations of trifunctional surface modification agent will range, generally from about 1 percent to about 10 percent, by weight.

Preferred concentrations of surface modification agent will range from about 5 percent to about 85 percent, or greater, for difunctional reagents, e.g., for DMDAS.

As exemplified herein, the tested multifunctional surface modification agent was mixed with a suitable solvent/co-solvent in liquid phase. Suitable co-solvents are those solvents in which the surface modification agent and any other optional materials are soluble, but which will not dissolve the dielectric material to be treated or interfere with the silylation of the treated surface and which can be readily removed by evaporation and/or heating after the surface modification reaction is complete. Simply by way of example, and without limitation, such co-solvents include ethers, esters, ketones, glycol ethers, chlorinated solvents, low viscosity siloxanes and suitable combinations of the members of these solvent classes. The artisan will appreciate that the term, "low viscosity" as applied to siloxanes is that which is generally understood in the art, and will preferably range from about 1 to about 100 centistokes and preferably have a molecular weight ranging from about 160 to about 3800 Daltons. Exemplary low viscosity siloxanes useful in the inventive processes are commercially available, e.g., from Dow Corning.

Suitable solvents/co-solvents can be employed in concentrations ranging generally from about 0.5 to about 50 percent, or greater, by weight of the total solution. Exemplary ethers useful in the inventive processes include diethyl ether, diisopropyl ether, dibutyl ether and combinations thereof. Exemplary ethers useful in the inventive processes include: ethyl acetate, isopropyl acetate, n-butyl acetate, and combinations thereof Exemplary hydrocarbons useful in the inventive processes include: n-hexane, n-heptane, cyclohexanes, toluene, and combinations thereof Exemplary ketones useful in the inventive processes include: acetone, 3-pentanone, methyl isobutyl ketone, and combinations thereof Exemplary glycol ethers useful in the inventive processes include: tri(ethylene glycol)dimethyl ether, tetra (ethylene glycol)dimethyl ether, tri(propylene glycol) dimethyl ether, and combinations thereof Exemplary chlorinated solvents useful in the inventive processes include: 1,2-dichloroethane, carbon tetrachloro, chloroform, and combinations thereof As exemplified hereinbelow, 3-pentanone is a preferred co-solvent, in amounts ranging from about 0.5 to about 50 percent, or greater, or more preferably in amounts ranging from about 1.7 to 10 percent, by weight of the total solution.

The solution including the surface modification agent is then applied by art-standard methods to the dielectric film on the substrate, e.g., the surface modification agent solution was spun onto various test films. Thereafter, the substrate and the treated film was heated to a temperature and for a time period sufficient to drive off remaining surface modification agent and co-solvent. In one preferred embodiment the film is then cured. Optionally, the heating steps can be conducted in a plurality of stages, each stage utilizing similar or differing times and temperatures, or combined into a single process step. For example, the heat treatment was conducted under air at 175 and 320° C., respectively. The treated film was thereafter cured, e.g., at 400° C.

Properties of Produced Nanoporous Dielectric Films

Nanoporous silica films formed on a substrate for use according to the invention are generally formed with a porosity of about 20% or greater and with pore sizes that range from about 1 nm to about 100 nm, more preferably from about 2 nm to about 30 nm, and most preferably from about 3 nm to about 20 nm. The density of the silicon containing composition, including the pores, ranges from about 0.1 to about 1.9 g/cm$^3$, more preferably from about 0.25 to about 1.6 g/cm$^3$, and most preferably from about 0.4 to about 1.2 g/cm$^2$.

Thus, the nanoporous silica films produced by the processes of the invention preferably have a moisture stable dielectric constant that is less than about 3. More preferably, the nanoporous silica films of the invention have a dielectric constant ranging from about 1.1 to about 3.0, even more preferably from about 1.3 to about 2.5, and most preferably from about 1.7 to about 2.0.

Non-Porous Silica Dielectric Films

In a further beneficial result of the present invention, it will be appreciated that the above-described methods and compositions can be optionally applied to non-porous silica dielectric materials, in order to, e.g., stabilize such materials against the effects of environmental moisture and the like, for use as insulators and dielectrics in microelectronic and/or integrated circuit products, as may be desired, for utilities where a very low dielectric constant and/or porosity is not required. Such non-porous silica-based dielectric materials include, for example, films deposited by art-standard methods, e.g., chemical vapor deposition ("CVD"), dip coating, spray coating, or any other similar materials that have surface silanols which it is desirable to cap.

Preferably, such silica dielectric materials are formed by CVD. However, the produced film tends to have free silanols on the surface that will adsorb environmental moisture. Thus, application of the methods of the present invention will usefully cap these free silanols, even on non-porous dielectric silica materials.

The following non-limiting examples serve to further explain and illustrate the invention.

EXAMPLE 1

Films Treated With MTAS

A nanoporous silica precursor was synthesized by adding 208 nL of tetraethoxysilane, 94 mL of triethyleneglycol monomethyl ether(TriEGMME), 16.8 mL deionized water, and 0.68 mL of 1N nitric acid together in a round bottom flask. The solution was allowed to mix vigorously and heated (heating and stirring were begun at the same time) to about 80° C. and refluxed for 1.5 hours, to form a clear solution. The resulting solution was allowed to cool down to room temperature and then it was diluted 25% by weight with ethanol, and filtered through a 0.1 micron Teflon® filter.

About 2 mL of the nanoporous silica precursor was deposited onto a 4" silicon wafer and then spun at 2500 rpm for 30 seconds. Then the film was gelled/aged in a vacuum chamber using the following conditions:
1. The chamber was evacuated to 250 torr.
2. 15M ammonium hydroxide was heated and equilibrated at 45° C. and introduced into the chamber to increase the pressure to 660 torr for 4 minutes.
3. The chamber was refilled with air and the film was removed from the chamber for surface treatment/solvent exchange.

The surface treatment/solvent exchange of the film was carried out using the following conditions:
1. The reagent used for the surface modification was prepared by mixing 5 grams of MTAS (Gelest, Tullytown, Pa. 19007) with 95 grams of 3-pentanone to form a clear colorless solution.
2. The aged film was put on the spinning chuck and spun at 250 rpm.
3. About 30 mL of the above MTAS solution was spun on the film without the allowing the film to dry for 20 seconds.
4. Then the film was spun dry at 2500 rpm for 10 second and then the film was removed from the chuck and subjected to heat treatment, as follows.

The film obtained from the above process was then heated at 175 and 320° C., under air, for 60 seconds for each step, respectively. Then it was cured in a furnace at 400° C. for 30 minute under nitrogen. The refractive index of the obtained film was measured by Woollam ellipsometer by standard methods. In some of the following examples, ellipsometry was also used to determined the thickness of the produced film.

Determination of Dielectric Constant

The dielectric constant was measured by the standard CV curve technique, using MOS capacitor ("MOSCAP") structure as follows. The MOSCAP structure is formed by sputtering aluminum onto the film through a circular dot mask and an aluminum blanket film is also sputtered onto the back side of the wafer. An appropriately biased voltage was applied to the MOSCAP and the capacitance was then measured at 1 MHz. This method was employed for dielectric constant determinations in all subsequent examples.

Determination of Film Mechanical Strength

The force required to break the film was determined by an art-standard stud-pull test. The film to be tested was placed on substrate wafer, and an aluminum layer was placed on top of the film to prevent penetration of the pore structure by the subsequently applied epoxy. An epoxy test stud was then epoxied to the top of the aluminized film. Once the epoxy was cured, the stud was pulled away from the film, with a measured force, until some component broke. The measured pull force at the moment just prior to breakage was reported the stud pull strength. For the films tested herein, the break point was generally within the film itself As described below and in the following examples, the stud-pull is defined as the force exerted on the workpiece, at the moment of mechanical failure, measured in kilopounds per square inch ("KPSI").

TABLE 1

Test Results for Example 1

| | R.I. | Dielectric Constant | Stud Pull (KPSI) | Onset of Thermal Out-gassing |
|---|---|---|---|---|
| Ex 1 | 1.1565 | 1.98 | 1.5 | >400C |

EXAMPLE 2

Films Treated With Hexamethyldisilazane

This example illustrates the process of surface treatment with hexamethyldisilazane ("HMDZ"), a mono-functional reagent. The properties of the prepared film were then compared to the film treated with trifunctional reagent prepared for Example 1.

A film was processed with the use of a mixture of 50/50 (by volume) of HMDZ and 3-pentanone as the surface treatment reagent. The detail of the process is described below: A nanoporous silica precursor was synthesized by adding 208 mL of tetraethoxysilane, 94 mL of triethyleneglycol monomethyl ether (TriEGMME), 16.8 mL deionized water, and 0.68 mL of 1N nitric acid together in a round bottom flask. The solution was mixed, heated, refluxed, cooled and filtered through a 0.1 micron Teflon® filter as described above for Example 1.

About 2 mL of the nanoporous silica precursor was deposited onto a 4" silicon wafer and then spun at 2500 rpm for 30 seconds. The film was then gelled/aged in a vacuum chamber using the same three-step process described in Example 1, above and then the surface treatment/solvent exchange of the film was carried out using the following conditions:
1. The reagent used for the surface modification was prepared by mixing 250 mL of HMDZ with 250 mL of 3-pentanone to form a clear colorless solution.
2. The aged film was put on the spinning chuck and spun at 250 rpm.
3. About 30 mL of the above HMDZ/3-pentanone solution was spun on the film without allowing the film to dry, for 20 seconds.
4. Then the film was spun dry at 2500 rpm for 10 seconds, and then the film was removed from the chuck and subjected to heat treatment, as described above for Example 1.

The refractive index and dielectric constant were obtained as described above for Example 1, and are shown in Table 2, as follows. The thickness of the obtained film was 8570 Angstroms.

TABLE 2

Test Results for Example 2

| Refractive Index | Dielectric Constant | Stud Pull (KPSI) | Onset of Thermal Out-gassing |
|---|---|---|---|
| 1.135 | 20 (at 1 MHz) | <0.5 | 300C |

EXAMPLE 3

Films Treated With Dimethyldiacetoxysilane

This example illustrates the process of surface treatment with dimethyldiacetoxysilane ("DMDAS") a di-functional reagent. The properties of the prepared film were then compared to those of the film treated with the trifunctional reagent of Example 1 and the monofunctional reagent of Example 2.

The precursor was synthesized by adding 104.0 mL of tetraethoxysilane (Pacific Pac, Hollister, Calif. 95023), 51.0 mL of Triethylene glycol mono methyl ether (TriEGMME) (Pacific Pac, Hollister, Calif. 95023), 8.4 mL of deionized water, and 0.34 mL of 1N nitric acid (J. T. Baker, Phillipsburg, N.J. 06885) together in a round bottom flask. The solution was mixed, heated, refluxed, cooled and filtered through a 0.1 micron Teflon® filter as described above for Example 1.
1. Approximately 2.0–4.0 ml of the precursor formed above was deposited separately onto two 4" inch silicon wafers, and spun at 2500 rpm for 30 seconds. The film was gelled and aged in a vacuum chamber using the following conditions: (a) the chamber was evacuated to about 254 torr; (b) next, 15M ammonium hydroxide (Aldrich Chemical Company, Milwaukee, Wis. 53201) was heated and equilibrated at 45° C. and dosed into the chamber to increase the pressure to about 660 torr for 3 minutes; and (c) finally, the chamber was evacuated to about 254 torr and back-filled with air.

The film was then solvent exchanged by the following process: a 75% (by vol.) mixture of DMDAS (Gelest Inc., Tullytown, Pa. 19007) in 3-pentanone (Aldrich Chemical Company, Milwaukee, Wis. 53201) were mixed together. Approximately 20–30 mls of the mixture was deposited on the film while spinning at 250 rpm's for 20 seconds without allowing the film to dry. The film was then spun dry at 1000 rpm for 5 seconds.
2. The film was heated at elevated temperatures for 1 min. each at 175° C. and 320° C. in air.
3. The film was characterized by ellipsometry, as for Example 1, above, to determine the refractive index and thickness. Table 3, below, lists the properties of the produced film.

TABLE 3

Characterization Results of 75% DMDAS/3-Pentanone Film

|  | Film 1 |
|---|---|
| Thickness (A) | 9100 |
| Refractive Index | 1.145 |
| Stud Pull (KPSI) | <0.5 |

EXAMPLE 4

Comparison of Films of Exs 1–3

This example provides a comparison of the mechanical properties of the products of Examples 1–3, above. As can be appreciated from the data presented in Table 4, below, it is clear that the porous silica films treated with trifunctional reagents shows better mechanical properties and thermal stability.

TABLE 4

Comparison of the Properties of MTAS, DMDAS and HMDZ Treated Films

|  | MTAS (tri-functional) | DMDAS (di-functional) | HMDZ (mono-functional) |
|---|---|---|---|
| K | 2.0 | NA | 2.0 |
| Stud Pull (KPSI) | 1.5 | <0.5 | <0.5 |
| On-Set of Thermal Out-gassing | >400° C. | NA | 300° C. |

In order to confirm that the MTAS treated film had a reduced organic content relative to HMDZ treated films, Fourier transform infrared spectroscopy (FTIR) was applied to the produced dielectric films.

Infrared Spectrographic Analysis

Figure 1:
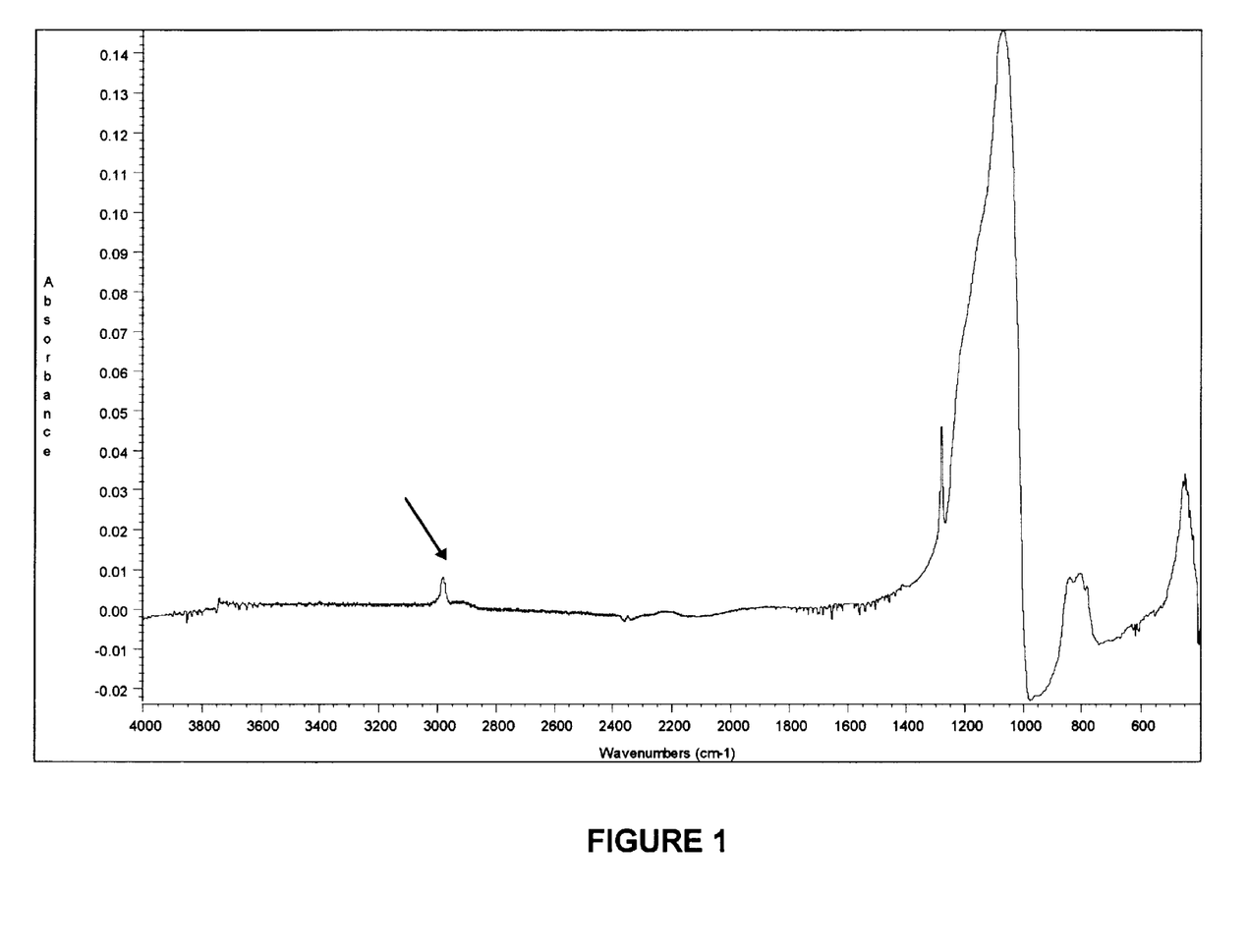
FIG. 1 is a Fourier transform infrared ("FTIR") spectra of the film produced by Example 1 using 5% MTAS as a surface modification agent to treat a dielectric film produced using TEOS/TriEGMME (208 ml/16.8 ml).
Figure 2:
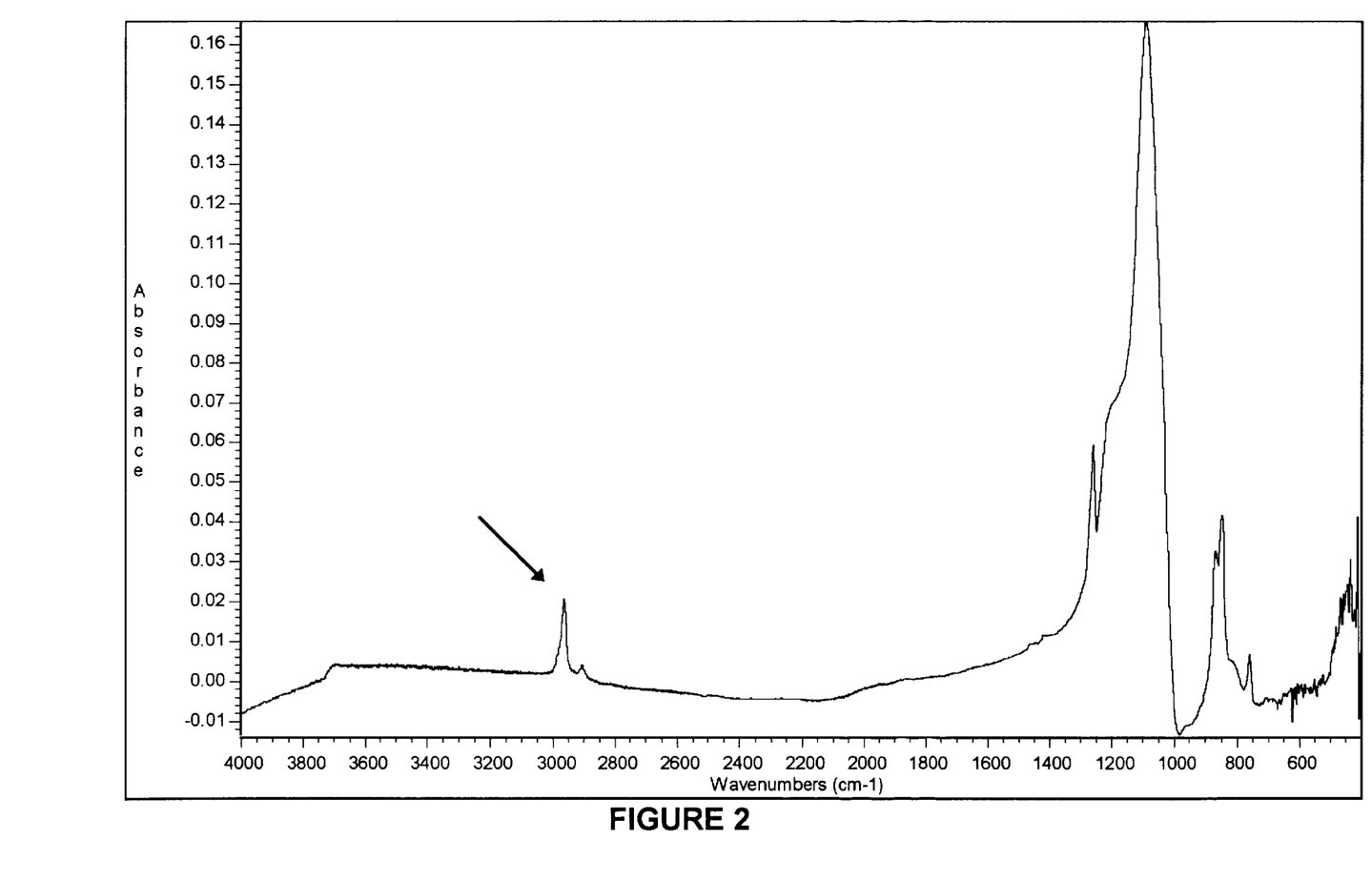
FIG. 2 is an FTIR spectra of the film produced by Example 2 using 50% HMDZ as a surface modification agent to treat a dielectric film produced using TEOS/TriEGMME (208 ml/16.8 ml).

FIG. 1 is an FTIR of a film produced by Example 1 [5% MTAS to treat a dielectric film produced using TEOS/TriEGMME]. FIG. 1 shows a very small peak at the 2900 cm$^{-1}$ wavelength (Arrow), corresponding to absorbance at a carbon-hydrogen "stretch." FIG. 2 is an FTIR of a film produced by Example 2 [50% HMDZ to treat a dielectric film produced using TEOS/TriEGMME ]with a much stronger absorbance at the 2900 cm$^{-1}$ wavelength (Arrow). This difference in absorbance at the C-H peak confirms that MTAS treated films contain substantially fewer moles of organic moieties than do analogously prepared HMDZ-treated films. As the artisan will appreciate from an inspection of FIGS. 1 and 2, both the HMDZ and MTAS-treated films show no significant rise in absorbance over baseline in the infrared spectrum ranging from about 3200 cm$^{-1}$ to about 3700 cm$^{-1}$, thus confirming that a significant proportion of the silanol groups have been converted or capped.

EXAMPLE 5

TriEGMME Film Treated by 3% MTAS

A nanoporous silica precursor was synthesized by adding 208 mL of tetraethoxysilane, 94 mL of triethyleneglycol monomethyl ether (TRIEGMME), 16.8 mL deionized water, and 0.68 mL of 1N nitric acid together in a round bottom flask. The solution was mixed, heated, refluxed, cooled and filtered through a 0.1 micron Teflon® filter as described above for Example 1.

About 2 mL of the nanoporous silica precursor was deposited onto a 4" silicon wafer and then spun at 2500 rpm for 30 seconds. The film was then gelled/aged in a vacuum chamber using the same three-step process described in Example 1, above and then the surface treatment/solvent exchange of the film was carried out using the following conditions:
1. The reagent used for the surface modification was prepared by mixing 3 grams of MTAS (Gelest, Tullytown, Pa. 19007) with 97 grams of 3-pentanone to form a clear colorless solution.
2. The aged film was put on the spinning chuck and spun at 250 rpm.
3. About 30 mL of the above MTAS solution was spun on the film without the allowing the film to dry for 20 seconds.
4. Then the film was spun dry at 2500 rpm for 10 second and then the film was removed from the chuck and subjected to heat treatment, as described above for Example 1.

The refractive index was measured to be 1.1495, and the dielectric constant was measured to be 1.99, by the methods described in Example 1, above. FTIR spectroscopy [Figure not shown] confirmed results similar to that shown by the FTIR of FIG. 2.

EXAMPLE 6

TriEGMME Film Treated by 5% MTAS

A nanoporous silica precursor was synthesized by adding 208 mL of tetraethoxysilane, 94 mL of triethyleneglycol monomethyl ether (TriEGMME), 16.8 mL deionized water, and 0.68 mL of 1N nitric acid together in a round bottom flask. The solution was mixed, heated, refluxed, cooled and filtered through a 0.1 micron Teflon® filter as described above for Example 1.

About 2 mL of the nanoporous silica precursor was deposited onto a 4" silicon wafer and then spun at 2500 rpm for 30 seconds. Then the film was gelled/aged in a vacuum chamber using the following conditions:
1. 2 mL 15M ammonium hydroxide was put inside a Petri dish for 5 minutes.
2. The spun film was put inside the Petri dish for 10 minute to allow the ammonium hydroxide vapor catalyzing the gelation/aging of the spun films.
3. The wafer was then removed from the Petri dish and subjected to a surface treatment/solvent exchange process.

The surface treatment/solvent exchange of the film was carried out using the following conditions:
1. The reagent used for the surface modification was prepared by mixing 5 grams of MTAS (Gelest, Tullytown, Pa. 19007) with 95 grams of 3-pentanone to form a clear colorless solution.
2. The aged film was put on the spinning chuck and spun at 250 rpm.
3. About 30 mL of the above MTAS solution was spun on the film without the allowing the film to dry for 20 seconds.
4. Then the film was spun dry at 2500 rpm for 10 second and then the film was removed from the chuck and subjected to heat treatment as described above for Example 1.

The refractive index of the obtained film was 1.1471 at 633 nm, the thickness was measured to be 8069 Angstrom, and the dielectric constant was 1.78, using the methods described for Example 1, above. FTIR spectroscopy [Figure not shown] confirmed results similar to that shown by the FTIR of FIG. 2.

EXAMPLE 7

TriEGMME Film Treated by 1.7% MTAS

A nanoporous silica precursor was synthesized by adding 208 mL of tetraethoxysilane, 94 mL of triethyleneglycol monomethyl ether (TriGMME), 16.8 mL deionized water, and 0.68 mL of 1N nitric acid together in a round bottom flask. The solution was mixed, heated, refluxed, cooled and filtered through a 0.1 micron Teflon® filter as described above for Example 1.

About 2 mL of the nanoporous silica precursor was deposited onto a 4" silicon wafer and then spun at 2500 rpm for 30 seconds. The film was then gelled/aged in a vacuum chamber using the same three-step process described in Example 1, above and then the surface treatment/solvent exchange of the film was carried out using the following conditions:
1. The reagent used for the surface modification was prepared by mixing 1.7 grams of MTAS (Gelest, Tullytown, Pa. 19007) with 98.3 grams of 3-pentanone to form a clear colorless solution.
2. The aged film was put on the spinning chuck and spun at 250 rpm.
3. About 30 mL of the above MTAS solution was spun on the film without the allowing the film to dry for 20 seconds.
4. Then the film was spun dry at 2500 rpm for 10 second and then the film was removed from the chuck and subjected to heat treatment as described above for Example 1.

The refractive index of the obtained film was 1.1436 at 633 nm, the thickness was 7778 Angstrom, and the dielectric constant was 1.75, determined as described above for Example 1. FTIR spectroscopy [Figure not shown] confirmed results, with respect to the C-H stretch that were similar to that shown by the FTIR of FIG. 2, but with a weaker absorbance at the 2900 $cm^{-1}$ wavelength.

EXAMPLE 8

Film Aged Using Method of Ex. 6 and Treated by 3% MTAS

A nanoporous silica precursor was synthesized by adding 208 mL of tetraethoxysilane, 94 mL of triethyleneglycol monomethyl ether (TIEGE), 16.8 mL deionized water, and 0.68 mL of 1N nitric acid together in a round bottom flask. The solution was mixed, heated, refluxed, cooled and filtered through a 0.1 micron Teflon® filter as described above for Example 1.

About 2 mL of the resulting nanoporous silica precursor was deposited onto a 4" silicon wafer and then spun at 2500 rpm for 30 seconds. The film was then gelled/aged in a vacuum chamber using the same three-step process described in Example 6, above and then the surface treatment/solvent exchange of the film was carried out using the following conditions:
1. The reagent used for the surface modification was prepared by mixing 3 grams of MTAS (Gelest, Tullytown, Pa. 19007) with 97 grams of 3-pentanone to form a clear colorless solution.
2. The aged film was put on the spinning chuck and spun at 250 rpm.
3. About 30 mL of the above MTAS solution was spun on the film without allowing the film to dry, for 20 seconds.
4. Then the film was spun dry at 2500 rpm for 10 second and then the film was removed from the chuck and subjected to heat treatment, as described above for Example 1.

The refractive index was 1.1357 at 633 nm, the thickness was 8041 Angstrom, and the dielectric constant was 1.75, measured as discussed in Example 1, above. FTIR spectroscopy [Figure not shown] confirmed results, with respect to the C-H stretch that were similar to that shown by the FTIR of FIG. 2. However, an absorbance peak was observed at about 3700 cm−1, of about the same amplitude as the C-H stretch peak, which is believed to correspond to silanol absorbance.

EXAMPLE 9

Film Aged by Method of Ex. 6 and Treated by 1.7% MTAS

A nanoporous silica precursor was synthesized by adding 208 mL of tetraethoxysilane, 94 mL of triethyleneglycol monomethyl ether (TIEGMME), 16.8 mL deionized water, and 0.68 mL of 1N nitric acid together in a round bottom flask. The solution was mixed, heated, refluxed, cooled and filtered through a 0. 1 micron Teflon® filter as described above for Example 1.

About 2 mL of the nanoporous silica precursor was deposited onto a 4" silicon wafer and then spun at 2500 rpm for 30 seconds. The film was then gelled/aged in a vacuum chamber using the same three-step process described in Example 6, above and then the surface treatment/solvent exchange of the film was carried out using the following conditions:

1. The reagent used for the surface modification was prepared by mixing 1.7 grams of MTAS (Gelest, Tullytown, Pa. 19007) with 98.3 grams of 3-pentanone to form a clear colorless solution.
2. The aged film was put on the spinning chuck and spun at 250 rpm.
3. About 30 mL of the above MTAS solution was spun on the film without the allowing the film to dry for 20 seconds.
4. Then the film was spun dry at 2500 rpm for 10 second and then the film was removed from the chuck and subjected to heat treatment, as described above for Example 1.

The refractive index was 1.1276 and the dielectric constant was 1.89, measured as described above for Example 1.

EXAMPLE 10

Comparison of Examples 4–9 and Results

Data obtained from Examples 4–9 are compared in Table 5, below. As can be appreciated from an inspection of Table 5, all combinations of TriEGMME based film and MTAS treatment, ranging from 1.7% through 5% MTAS, resulted in refractive index values consistent with a relatively low density nanoporous silica film, and dielectric constant or k values ranging from 1.75 to 2.0 in a formulation that is thermally stable.

TABLE 5

Comparing Data From Examples 4–9

| Example No. and Test | R.I. | k | Stud Pull (KPSI) | Onset of Thermal Outgassing | Thickness (A) |
|---|---|---|---|---|---|
| 5 TriEGMME/3% MTAS | 1.1495 | 1.99 | N/A | >400° C. | N/A |
| 6 TriEGMME/5% MTAS | 1.147 | 1.78 | N/A | >400° C. | 8069 |
| 7 TriEGMME/1.7% MTAS | 1.1436 | 2.0 | N/A | >400° C. | 7778 |
| 8 TriEGMME/3% MTAS | 1.1357 | 1.75 | N/A | >400° C. | 8041 |
| 9 TriEGMME/1.7% MTAS | 1.1276 | 1.89 | N/A | >400° C. | N/A |

EXAMPLE 11

TriGMME Film Treated by 10% MTAS Solvent Exchange Before Heating Step

1. The precursor was synthesized by adding 104.0 mL of tetraethoxysilane (Pacific Pac, Hollister, Calif. 95023), 51.0 mL of Triethylene glycol mono methyl ether (TriEGM) (Pacific Pac, Hollister, Calif. 95023), 8.4 mL of deionized water, and 0.34 mL of 1N nitric acid (J. T. Baker, Phillipsburg, N.J. 06885) together in a round bottom flask. The solution was allowed to mix vigorously, then heated to about 80° C. (heating and stirring were started at the same time) and refluxed for 1.5 hours to form a solution. After the solution was allowed to cool to room temperature, it was stored under refrigeration at 4° C. The solution was then diluted 25% by weight with ethanol (Ricca Chemical Company, Arlington, Tex. 76012) to reduce the viscosity. The diluted precursor was then filtered through a 0.1 micron Teflon® filter.
2. Approximately 2.0–4.0 ml of the precursor was deposited individually onto two 4" inch silicon wafers, and spun at 2500 rpm for 30 seconds.
3. The films were gelled and aged separately in a vacuum chamber using the following conditions: 1) The chamber was evacuated to about 254 torr; 2) Next, 15M ammonium hydroxide (Aldrich Chemical Company, Milwaukee, Wis. 53201) was heated and equilibrated at 45° C. and dosed into the chamber to increase the pressure to about 660 torr for 3 minutes. 3) Finally, the chamber was evacuated to about 254 torr and back-filled with air.
4. The films were then solvent exchanged by which a 10% (by wt.) mixture of MTAS (Gelest Inc., Tullytown, Pa. 19007) in Tetraethylene glycol dimethyl ether (TEGDME) (Aldrich Chemical Company, Milwaukee, Wis. 53201) were mixed together. Approximately 20–30 mls of the mixture was deposited on the films while spinning at 250 rpm'for 20 seconds without allowing the film to dry. The films were then spun dry at 1000 rpm for 5 seconds.
5. The films were heated at elevated temperatures for 1 min. each at 175° C. and 320° C. in air.
6. The films were characterized by ellipsometry to determine the refractive indices and thickness' as described above by Example 1.
7. The films were cured for 0.5 hr. in a horizontal tube furnace which was pre-equilibrated at 400° C. under flowing nitrogen conditions to ensure the oxygen levels in the furnace were less than 20 parts per million.

TABLE 6

Characterization Results of 10% MTAS/TEGDME Films

|  | Film 1 | Film 2 |
|---|---|---|
| Thickness (A) | 9363 | 9241 |
| Refractive Index | 1.164 | 1.161 |

EXAMPLE 12

TriEGMME Film Treated by 10% MTAS Solvent Exchange After Heating Step

1. The precursor was synthesized by adding 104.0 mL of tetraethoxysilane (Pacific Pac, Hollister, Calif. 95023), 51.0 mL of Triethylene glycol mono methyl ether (TriGMME) (Pacific Pac, Hollister, Calif. 95023), 8.4 mL of deionized water, and 0.34 mL of 1N nitric acid (J. T. Baker, Phillipsburg, N.J. 06885) together in a round bottom flask. The solution was then mixed, heated, refluxed, diluted and filtered through a 0.1 micron Teflon® filter to prepare the precursor as described above for Example 11.
2. Approximately 2.0–4.0 ml of the precursor was deposited individually onto two 4" inch silicon wafers, and spun at 2500 rpm for 30 seconds.

3. The films were then gelled and aged as described above for Example 11.
4. The films were heated at elevated temperatures for 1 min. each at 175° C. and 320° C. in air.
5. The films were then solvent exchanged as described above for step for of Example 11, above, except that, in contrast to Example 11, these films have been previously heat treated.
6. The films were heated at elevated temperatures for 1 min. each at 175° C. and 320° C. in air.
7. The films were characterized by ellipsometry to determine the refractive indices and thickness'. In addition, the extent of hydrophobicity was measured by observing the height of the CH stretch of the infrared spectra. Table 7, below, lists the properties of the produced films.
8. The films were cured for 0.5hr. in a horizontal tube furnace which was pre-equilibrated at 400° C. under flowing nitrogen conditions to ensure the oxygen levels in the furnace were less than 20 parts per million.

TABLE 7

Characterization Results of 10% MTAS/TriEGDME Films

|  | Film 1 | Film 2 |
|---|---|---|
| Thickness (A) | 6334 | 6421 |
| Refractive Index | 1.22 | 1.21 |

1. The precursor was synthesized by adding 262.7 g of tetraethoxysilane (Pacific Pac, Hollister, Calif. 95023), 61.0 g of Triethylene glycol mono methyl ether (TriEGMME) (Pacific Pac, Hollister, Calif. 95023), 21.2 g of deionized water, 0.64 g of 1N nitric acid (J. T. Baker, Phillipsburg, N.J. 06885), and 55.3 g ethanol (Ricca Chemical Company, Arlington, Tex. 76012) together in a round bottom flask. The solution was then mixed, heated, refluxed, diluted and filtered through a 0.1 micron Teflon® filter to prepare the precursor as described above for Example 11.
2. Approximately 2.0–4.0 ml of the precursor was deposited onto a 4" inch silicon wafer, and spun at 2500 rpm for 30 seconds.
3. The film was then gelled and aged as described above for step 3 of Example 11.
4. The film was then solvent exchanged by which a 75% (by vol.) mixture of DMDAS (Gelest Inc., Tullytown, Pa. 19007) in 3-pentanone (Aldrich Chemical Company, Milwaukee, Wis. 53201) were mixed together. Approximately 20–30 mls of the mixture was deposited on the film while spinning at 250 rpm's for 20 seconds without allowing the film to dry. The film was then spun dry at 1000 rpm for 5 seconds.
5. The film was heated at elevated temperatures for 1 min. each at 175° C. and 320° C. in air.
6. The film was characterized by ellipsometry to determine the refractive index and thickness. Table 8, below, lists the properties of the produced films.

TABLE 8

Characterization Results of 75% DMDAS/3-Pentanone Films

|  | Film 1 |
|---|---|
| Thickness (A) | 9100 |
| Refractive Index | 1.145 |

FTIR spectroscopy [Figure not shown] showed virtually no detectable organic moieties present at the 2900 cm$^{-1}$ wavelength corresponding to the C-H stretch.

EXAMPLE 14

75% DMDMS in 3-Pentanone TEOS/TriEGMME of 262/61

1. The precursor was synthesized by adding 104.0 mL of tetraethoxysilane (Pacific Pac, Hollister, Calif. 95023), 51.0 mL of Triethylene glycol mono methyl ether (TriGMME) (Pacific Pac, Hollister, Calif. 95023), 8.4 mL of deionized water, and 0.34 mL of 1N nitric acid (J. T. Baker, Phillipsburg, N.J. 06885) together in a round bottom flask. The solution was then mixed, heated, refluxed, diluted and filtered through a 0.1 micron Teflon® filter to prepare precursor as described above for Example 11.
2. Approximately 2.0–4.0 ml of the precursor was deposited separately onto two 4" inch silicon wafers, and spun at 2500 rpm for 30 seconds.
3. The films were then gelled and aged as described above for step 3 of Example 11.
4. The gelled and aged films were then solvent exchanged with 75% (by vol.) DMDMS in 3-pentanone, as for step 4 of Example 13, above.
5. The films were heated at elevated temperatures for 1 min. each at 175° C. and 320° C. in air.
6. The films were characterized by ellipsometry to determine the refractive indices and thickness'. In addition the cohesive strength of the film was determine by a standard stud pull technique. Table 9, below, lists the properties of the produced films.
7. The films were cured for 0.5 hr. in a horizontal tube furnace which was pre-equilibrated at 400° C. under flowing nitrogen conditions to ensure the oxygen levels in the furnace were less than 20 parts per million.

TABLE 9

Characterization Results of 75% DMDAS/3-Pentanone Films

|  | Film 1 | Film 2 |
|---|---|---|
| Thickness (A) | 5398 | 4822 |
| Refractive Index | 1.192 | 1.21 |
| Stud Pull (Kpsi) | 0.89 | 0.43 |

EXAMPLE 15

5% MTCS in Acetone

1. The precursor was synthesized by adding 104.0 mL of tetraethoxysilane (Pacific Pac, Hollister, Calif. 95023), 51.0 mL of Triethylene glycol mono methyl ether (TriEGMME) (Pacific Pac, Hollister, Calif. 95023), 8.4 mL of deionized water, and 0.34 mL of 1N nitric acid (J. T. Baker, Phillipsburg, N.J. 06885) together in a round bottom flask. The solution was then mixed, heated, refluxed, diluted and filtered through a 0.1 micron Teflon® filter to prepare precursor as described above for Example 11.
2. Approximately 2.0–4.0 ml of the precursor was deposited onto a 4" inch silicon wafer, and spun at 2500 rpm for 30 seconds.

3. The film was then gelled and aged as described above for step 3 of Example 11.
4. The film was then solvent exchanged by which a 5% (by vol.) mixture of methyltrichlorosilane (MTCS) (Gelest Inc., Tullytown, Pa. 19007) in acetone (Aldrich Chemical Company, Milwaukee, Wis. 53201) were mixed together. Approximately 20–30 mls of the mixture was deposited on the film while spinning at 250 rpm's for 20 seconds without allowing the film to dry. The film was then spun dry at 1000 rpm for 5 seconds.
5. The film was heated at elevated temperatures for 1 min. each at 175° C. and 320° C. in air.
6. The film was characterized by ellipsometry to determine the refractive index and thickness. Table 10, below, lists the properties of the produced films.

TABLE 10

Characterization Results of 5% MTCS/Acetone Film

|  | Film 1 |
|---|---|
| Thickness (A) | 4200 |
| Refractive Index | 1.245 |

1. The precursor was synthesized by adding 104.0 mL of tetraethoxysilane (Pacific Pac, Hollister, Calif. 95023), 51.0 mL of Triethylene glycol mono methyl ether (TriGMME) (Pacific Pac, Hollister, Calif. 95023), 8.4 mL of deionized water, and 0.34 mL of 1N nitric acid (J. T. Baker, Phillipsburg, N.J. 06885) together in a round bottom flask. The solution was then mixed, heated, refluxed, diluted and filtered through a 0.1 micron Teflon® filter to prepare precursor as described above for Example 11.
2. Approximately 2.0–4.0 ml of the precursor was deposited onto a 4" inch silicon wafer, and spun at 2500 rpm for 30 seconds.
3. The film was then gelled and aged as described above for step 3 of Example 11.
4. The film was then solvent exchanged with a 5% (by vol.) mixture of MTCS in a solvent, as for step 4 of example 15, above, but with heptane substituted for the acetone of that example.
5. The film was heated at elevated temperatures for 1 min. each at 175° C. and 320° C. in air.
6. The films were characterized by ellipsometry to determine the refractive index and thickness. Table 11, below, lists the properties of the produced films.

TABLE 11

Characterization Results of 5% MTCS/Heptane Film

|  | Film 1 |
|---|---|
| Thickness (A) | 6370 |
| Refractive Index | 1.227 |

What is claimed is:

1. A hydrophobic dielectric film produced by a process comprising the steps of reacting a suitable hydrophilic silica film with an effective concentration of a surface modification agent, wherein said silica film is present on a substrate and wherein said reaction is conducted under suitable conditions and for a period of time sufficient for said surface modification agent to produce a treated silica film that is substantially hydrophobic, wherein said surface modification agent is multifunctional and wherein said surface modification agent is a compound having a formula selected from the group consisting of $R_1Si(NR_2R_3)_3$; $R_1Si(ON=CR_2R_3)_3$; and $(R_1)_xSi(OCOR_2)_y$, and combinations thereof, wherein $R_1$, $R_2$ and $R_3$ are independently H, alkyl, aryl, and x is an integer ranging in value from 1 to 2, and y is an integer ranging in value from 2 to about 3, and x and y are the same or different.

2. The hydrophobic dielectric film of claim 1 wherein a Fourier transform infrared spectroscopic measurement reveals no significant silanol absorbance in the wavelengths ranging from about 3000 to about 3700 $cm^{-1}$.

3. The dielectric film of claim 1 wherein said substrate comprises a semiconductor material selected from the group consisting of gallium arsenide, crystalline silicon, polysilicon, amorphous silicon, epitaxial silicon, silicon dioxide, and mixtures thereof.

4. The dielectric film of claim 1 wherein said produced hydrophobic silica film has a dielectric constant of less than 3.

5. An integrated circuit comprising at least one dielectric silica film of claim 1.

6. The integrated circuit of claim 5 that further comprises a pattern of raised lines formed of at least one material selected from the group consisting of silica, silicon nitride, titanium nitride, tantalum nitride, aluminum, aluminum alloys, copper, copper alloys, tantalum, tungsten, silicon oxynitride and combinations thereof.

7. The film of claim 1 wherein said alkyl moiety is substituted or unsubstituted and is selected from the group consisting of straight alkyl, branched alkyl, cyclic alkyl and combinations thereof, and wherein said alkyl moiety ranges in size from $C_1$ to about $C_{18}$.

8. The film of claim 1 wherein said aryl moiety is substituted or unsubstituted and ranges in size from $C_5$ to about $C_{18}$.

9. The film of claim 1 wherein said surface modification agent is selected from the group consisting an alkylacetoxysilane, arylacetoxysilane and combinations thereof.

10. The film of claim 1 wherein said surface modification agent is selected from the group consisting of tris(dimethylamino)methylsilane, tris(dimethylamino)phenylsilane, tris(dimethylamino)silane, methyltris(methylethylkeoxime)silane, methyltriacetoxysilane, dimethyldiacetoxysilane, phenyltriacetoxysilane, methyltrimethoxysilane, diphenyldiacetoxysilane and combinations thereof.

* * * * *